United States Patent [19]
Chew

[11] Patent Number: 5,858,876
[45] Date of Patent: Jan. 12, 1999

[54] SIMULTANEOUS DEPOSIT AND ETCH METHOD FOR FORMING A VOID-FREE AND GAP-FILLING INSULATOR LAYER UPON A PATTERNED SUBSTRATE LAYER

[75] Inventor: Peter Chew, Singapore, Singapore

[73] Assignee: Chartered Semiconductor Manufacturing, Ltd., Singapore, Singapore

[21] Appl. No.: 617,701

[22] Filed: Apr. 1, 1996

[51] Int. Cl.[6] ..................................................... H01L 21/02
[52] U.S. Cl. .......................... 438/695; 438/697; 438/712; 438/723; 427/585
[58] Field of Search ..................................... 437/228, 235, 437/238, 240, 225; 216/37; 427/255.3, 99, 579, 585; 438/694, 695, 697, 712, 723

[56] References Cited

U.S. PATENT DOCUMENTS

| | | | |
|---|---|---|---|
| 4,676,868 | 6/1987 | Riley et al. | 156/643 |
| 4,872,947 | 10/1989 | Wang et al. | 156/643 |
| 5,275,977 | 1/1994 | Otsubo et al. | 437/235 |
| 5,354,715 | 10/1994 | Wang et al. | 437/238 |
| 5,554,565 | 9/1996 | Liaw et al. | 437/192 |

OTHER PUBLICATIONS

Korczynski et al, "Improved Sub–Micron Inter–Metal Dielectric Gap–Filling Using Teoslozone APCVD" Microelectronics Manufacturing Technology, Jan. 1992, pp. 22–27.

*Primary Examiner*—Marion McCamish
*Assistant Examiner*—Cheryl Juska
*Attorney, Agent, or Firm*—George O. Saile; Stephen B. Ackerman; Alek P. Szecsy

[57] ABSTRACT

A method for forming a void-free and gap-filling doped silicon oxide insulator layer upon a patterned substrate layer within an integrated circuit. Formed upon a semiconductor substrate is a patterned substrate layer. Formed upon the patterned substrate layer is a doped silicon oxide insulator layer. The doped silicon oxide insulator layer is formed through a Plasma Enhanced Chemical Vapor Deposition (PECVD) deposition method undertaken simultaneously with a Reactive Ion Etch (RIE) etch-back method. The Plasma Enhanced Chemical Vapor Deposition (PECVD) deposition method and the Reactive Ion Etch (RIE) etch-back method simultaneously employ a Tetra Ethyl Ortho Silicate (TEOS) silicon source material, a dopant source material, an oxygen source material and an etching gas.

24 Claims, 3 Drawing Sheets

SIMULTANEOUS DEPOSIT AND ETCH METHOD FOR FORMING A VOID-FREE AND GAP-FILLING INSULATOR LAYER UPON A PATTERNED SUBSTRATE LAYER

BACKGROUND OF THE INVENTION

1. Field of the Invention

The present invention relates generally to insulator layers within integrated circuits. More particularly, the present invention relates to methods for forming void-free and gap-filling doped silicon oxide insulator layers upon high aspect ratio narrow line-width patterned substrate layers within integrated circuits.

2. Description of the Related Art

As integrated circuit technology has advanced and integrated circuit device and conductor element dimensions have decreased, it has become increasingly important within advanced integrated circuits to form void-free and gap-filling insulator layers upon high aspect ratio narrow line-width patterned substrate layers. Most commonly, void-free and gap-filling insulator layers are desired to be formed upon high aspect ratio narrow line-width patterned conductor layers. As is known in the art of integrated circuit design and manufacture, voids typically form within an insulator layer formed upon a high aspect ratio narrow line-width patterned substrate layer at or near the apertures between the patterns within the high aspect ratio narrow line-width patterned substrate layer due to inhomogeneous filling of those apertures with insulator layers deposited through many conventional methods. The difficulty in forming void-free and gap-filling insulator layers upon high aspect ratio narrow line-width patterned substrate layers within integrated circuits typically increases as: (1) the width of the apertures between the patterns of the narrow line-width patterned substrate layers decreases, and (2) the aspect ratio of the apertures between the patterns of the narrow line-width patterned substrate layers increases.

Also important within advanced integrated circuit manufacture is the ability to form upon high aspect ratio narrow line-width patterned substrate layers void-free and gap-filling insulator layers which are easily planarized. When planarized, such void-free and gap-filling insulator layers are desirable since in addition to being merely void-free and gap-filling they also provide an insulator layer requiring minimal additional processing prior to forming upon the insulator layer additional integrated circuit layers.

Several methods have been disclosed in the art for forming and planarizing upon high aspect ratio narrow line-width patterned substrate layers within integrated circuits void-free and gap-filling insulator layers. For example, it is known in the art that void-free and gap-filling insulator layers may be formed and planarized upon high aspect ratio narrow line-width patterned substrate layers of decreased aperture width and increased aperture aspect ratio through multiple successive deposit and etch cycles of insulator layers which may be deposited through methods and materials which are otherwise conventional in the art. Unfortunately, the use of multiple successive deposit and etch cycles for forming such insulator layers typically requires substantial additional integrated circuit processing time.

As a time saving alternative for forming and planarizing void-free and gap-filling insulator layers upon high aspect ratio narrow line-width patterned substrate layers within integrated circuits, there has recently been disclosed in the art insulator layers formed at least in part through a Chemical Vapor Deposition (CVD) method employing oxygen, ozone and Tetra Ethyl Ortho Silicate (TEOS) source material mixtures at comparatively high deposition pressures and low deposition temperatures. For example, Wang et al. in U.S. Pat. No. 4,872,947 disclose a method for forming a planarized silicon oxide insulator layer upon a patterned substrate layer within an integrated circuit through planarizing through an isotropic etch method a highly conformal void-free and gap-filling silicon oxide insulator layer formed through a Chemical Vapor Deposition (CVD) method employing ozone, oxygen and Tetra Ethyl Ortho Silicate (TEOS) source materials at a reactor pressure in excess of 10 torr. Additional refinements upon the conditions under which may be formed this highly conformal void-free and gap-filling silicon oxide insulator layer are disclosed by Wang et al. In U.S. Pat. No. 5,354,715. Further, Korceynski et al., in "Improved Sub-Micron Inter-Metal Dielectric Gap-Filling Using TEOS/Ozone APCVD," Microelectronics Manufacturing Technology, January 1992, pp.22–27, disclose an analogous Chemical Vapor Deposition (CVD) method which employs ozone, oxygen and Tetra Ethyl Ortho Silicate (TEOS) source materials for forming void-free and gap-filling silicon oxide insulator layers at atmospheric pressure. The increased pressures employed by these Chemical Vapor Deposition (CVD) methods in forming void-free and gap-filling silicon oxide insulator layers provide shorter paths through which active species must travel prior to forming upon a high aspect ratio narrow line-width patterned substrate layer those silicon oxide insulator layers. Thus, the silicon oxide gap-filling insulator layers so formed are much more likely to be formed void-free.

From the foregoing it is thus desirable in the art to provide additional alternative methods and materials through which may be efficiently formed void-free and gap-filling insulator layers upon high aspect ratio narrow line-width patterned substrate layers within integrated circuits. It is towards that goal that the present invention is directed.

SUMMARY OF THE INVENTION

The object of the present invention is to provide a method for efficiently forming upon a high aspect ratio narrow line-width patterned substrate layer within an integrated circuit a void-free and gap-filling silicon oxide insulator layer.

In accord with the object of the present invention, there is provided a method for efficiently forming upon a high aspect ratio narrow line-width patterned substrate layer within an integrated circuit a void-free and gap-filling silicon oxide insulator layer. To form a silicon oxide insulator layer through the method of the present invention, there is first provided a semiconductor substrate having formed thereupon a patterned substrate layer. Formed upon the patterned substrate layer is a doped silicon oxide insulator layer. The doped silicon oxide insulator layer is formed through a Plasma Enhanced Chemical Vapor Deposition (PECVD) deposition method undertaken simultaneously with a Reactive Ion Etch (RIE) etch-back method. The Plasma Enhanced Chemical Vapor Deposition (PECVD) deposition method and the Reactive Ion Etch (RIE) etch-back method simultaneously employ a Tetra Ethyl Ortho Silicate (TEOS) silicon source material, a dopant source material, an oxygen source material and an etching gas.

The present invention provides a method for efficiently forming upon a high aspect ratio narrow line-width patterned substrate layer within an integrated circuit a void-free and gap-filling silicon oxide insulator layer. Through the simultaneous Plasma Enhanced Chemical Vapor Deposition (PECVD) deposition method and the Reactive Ion Etch (RIE) etch-back method of the present invention, a doped silicon oxide insulator layer, as it is formed upon a patterned substrate layer within an integrated circuit, is formed more slowly and evenly with less susceptibility to forming voids. The doped silicon oxide insulator layer is also formed more efficiently than analogous silicon oxide insulator layers formed through a sequential deposit and etch method conventional to the art since the Plasma Enhanced Chemical Vapor Deposition (PECVD) deposition method and Reactive Ion Etch (RIE) etch-back method of the method of the present invention are performed simultaneously. Finally, the doped silicon oxide insulator layer formed through the method of the present invention is formed from a Tetra Ethyl Ortho Silicate (TEOS) silicon source material which is known in the art to provide silicon oxide insulator layers of superior gap filling properties.

BRIEF DESCRIPTION OF THE DRAWINGS

The objects, features and advantages of the present invention are understood within the context of the description set forth below. The description is understood in conjunction with the accompanying drawings, which form a material part of this disclosure, wherein.

DESCRIPTION OF THE PREFERRED EMBODIMENT

The present invention provides a method for forming upon high aspect ratio narrow line-width patterned substrate layers within integrated circuits void-free and gap-filling doped silicon oxide insulator layers. In forming such void-free and gap-filling doped silicon oxide insulator layers, the method of the present invention employs a simultaneous Plasma Enhanced Chemical Vapor Deposition (PECVD) deposition method and Reactive Ion Etch (RIE) etch-back method which simultaneously employ a Tetra Ethyl Ortho Silicate (TEOS) silicon source material, a dopant source material, an oxygen source material and an etching gas.

The method of the present invention may be employed in forming void-free and gap-filling doped silicon oxide insulator layers upon high aspect ratio narrow line-width patterned substrate layers within various locations within integrated circuits. The method of the present invention may be employed in forming void-free and gap-filling doped silicon oxide insulator layers upon narrow line-width patterned substrate layers within the first insulator layer within an integrated circuit. The first insulator layer within an integrated circuit separates the active region of a semiconductor substrate from the first patterned conductor layer within the integrated circuit. Alternatively, the method of the present invention may also be employed in forming void-free and gap-filling doped silicon oxide insulator layers upon narrow line-width patterned substrate layers within second or subsequent insulator layers which separate second or subsequent patterned conductor layers within the same or other integrated circuits.

In addition to providing void-free and gap-filling doped silicon oxide insulator layers upon narrow line-width patterned substrate layers within several locations within integrated circuits, the method of the present invention may be also employed in providing void-free and gap-filling doped silicon oxide insulator layers upon narrow line-width patterned substrate layers within various types of integrated circuits. The method of the present invention may be employed in forming void-free and gap-filling doped silicon oxide insulator layers upon narrow line-width patterned substrate layers within integrated circuits including but not limited to Dynamic Random Access Memory (DRAM) integrated circuits, Static Random Access Memory (SWAM) integrated circuits, Application Specific Integrated Circuits (ASICs), integrated circuits having within their fabrications Field Effect Transistors (FETs), integrated circuits having within their fabrications bipolar transistors and integrated circuits having within their fabrications Bipolar Complementary Metal Oxide Semiconductor (BiCMOS) transistors.

Figure 1:
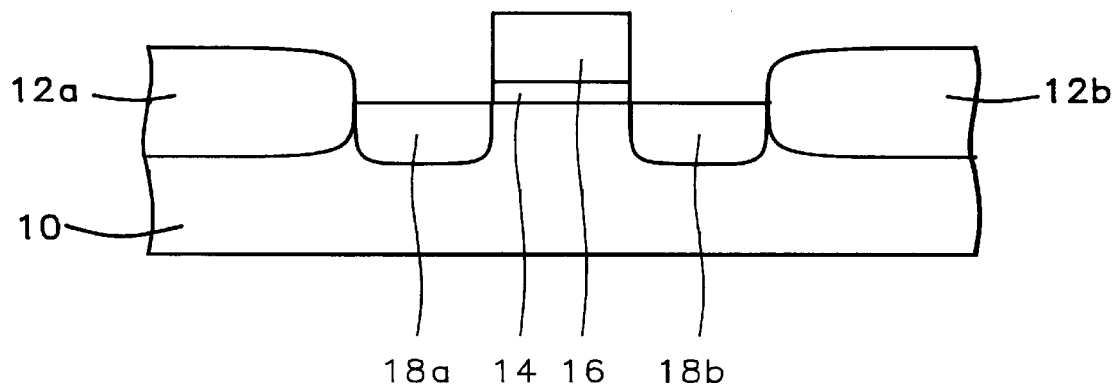
FIG. 1 to FIG. 5 show a series of schematic cross-sectional diagrams illustrating the results of progressive stages in forming and planarizing within an integrated circuit multiple void-free and gap-filling doped silicon oxide insulator layers upon high aspect ratio narrow line-width patterned substrate layers in accord with the preferred embodiment of the method of the present invention.

Referring now to FIG. 1 to FIG. 5 there is shown a series of schematic cross-sectional diagrams illustrating the results of progressive stages in forming and planarizing within an integrated circuit multiple void-free and gap-fling doped silicon oxide insulator layers upon multiple high aspect ratio narrow line-width patterned substrate layers in accord with the preferred embodiment of the method of the present invention. Shown in FIG. 1 is a schematic cross-sectional diagram of the integrated circuit at its early stages in formation.

Shown in FIG. 1 is a semiconductor substrate 10 upon and within whose surface are formed isolation regions 12a and 12b which define the active region of the semiconductor substrate 10. Semiconductor substrates upon which the present invention may be practiced may be formed of either dopant polarity, any dopant concentration and any crystallographic orientation. Typically, the semiconductor substrate 10 upon which is formed void-free and gap-filling doped silicon oxide insulator layers through the preferred embodiment of the method of the present invention is a (100) silicon semiconductor substrate having either a N- or P- doping.

Methods and materials through which isolation regions may be formed within and/or upon semiconductor substrates are also known in the art. Isolation regions may be formed within and/or upon semiconductor substrates through methods including but not limited to thermal oxidation methods whereby portions of a semiconductor substrate exposed through a suitable oxidation mask are oxidized to form isolation regions within and upon a semiconductor substrate, and isolation region deposition methods whereby an insulator material is independently deposited upon the surface of a semiconductor substrate and subsequently patterned to form isolation regions upon the semiconductor substrate. For the preferred embodiment of the method of the present invention, the isolation regions 12a and 12b are preferably formed through a thermal oxidation method whereby portions of the semiconductor substrate 10 exposed through a suitable oxidation mask are oxidized at a temperature of from about 900 to about 1100 degrees centigrade to form isolation regions 12a and 12b of silicon oxide within and upon the semiconductor substrate 10.

Also shown in FIG. 1 is the presence of a gate oxide layer 14 upon which resides a gate electrode 16. Methods and materials through which may be formed gate oxide layers and gate electrodes within integrated circuits formed upon semiconductor substrates are known in the art. Both gate oxide layers and gate electrodes are typically, although not exclusively, formed through patterning through methods as are conventional in the art of corresponding blanket gate oxide layers and blanket layers of gate electrode materials.

Blanket gate oxide layers may be formed through methods including but not limited to thermal oxidation methods, Chemical Vapor Deposition (CVD) methods, Plasma Enhanced Chemical Vapor Deposition (PECVD) methods and Physical Vapor Deposition (PVD) sputtering methods through which may be formed blanket gate oxide layers typically, although not exclusively, of silicon oxide. Analogously, blanket layers of gate electrode materials may be formed through methods including but not limited to Chemical Vapor Deposition (CVD) methods, Plasma Enhanced Chemical Vapor Deposition (PECVD) methods and Physical Vapor Deposition (PVD) sputtering methods through which may be formed blanket layers of gate electrode materials including but not limited to metals, metal alloys, highly doped polysilicon and polycides (polysilicon/metal silicide stacks). For the preferred embodiment of the method of the present invention, the gate oxide layer 14 is preferably formed through patterning through methods as are conventional in the art of a blanket gate oxide layer formed upon the active region of the semiconductor substrate 10 through a thermal oxidation method at a temperature of about 800 to about 900 degrees centigrade to yield a typical blanket gate oxide layer thickness of about 50 to about 150 angstroms. For the preferred embodiment of the method of the present invention, the gate electrode 16 is preferably formed through patterning through methods as are conventional in the art of a blanket layer of gate electrode material formed of either highly doped polysilicon or a polycide formed upon the blanket gate oxide layer at a thickness of about 2000 to about 4000 angstroms. After the gate electrode 16 has been patterned from the blanket layer of gate electrode material, the gate electrode 16 is typically employed in patterning the gate oxide layer 14 from the blanket gate oxide layer.

Finally, there is shown in FIG. 1 the presence of source/drain electrodes 18a and 18b formed into the surface of the active region of the semiconductor substrate 10 at locations not occupied by the isolation regions 12a and 12b, the gate oxide layer 14 and the gate electrode 16. Methods and materials through which source/drain electrodes may be formed within semiconductor substrates are known in the art. Source/drain electrodes are typically formed within semiconductor substrates through implanting into those semiconductor substrates dopant ions of sufficient dose and energy to form into those semiconductor substrates regions of conductivity sufficient for source/drain electrodes. Arsenic dopant species, boron dopant species and phosphorus dopant species are common in the art of forming source/drain electrodes. For the preferred embodiment of the method of the present invention, the source/drain electrodes 18a and 18b are preferably formed within the semiconductor substrate 10 through ion implanting a suitable dopant specie at an ion implantation dose of from about 1E15 to about 5E15 ions per square centimeter and an ion implantation energy of from about 30 to about 80 keV. Upon forming the source/drain electrodes 18a and 18b, there is formed within and upon the active region of the semiconductor substrate 10 bounded by the isolation regions 12a and 12b a Field Effect Transistor (FET) comprising the gate oxide layer 14 upon which resides the gate electrode 16, and adjoining which resides the pair of source/drain electrodes 18a and 18b.

Figure 2:
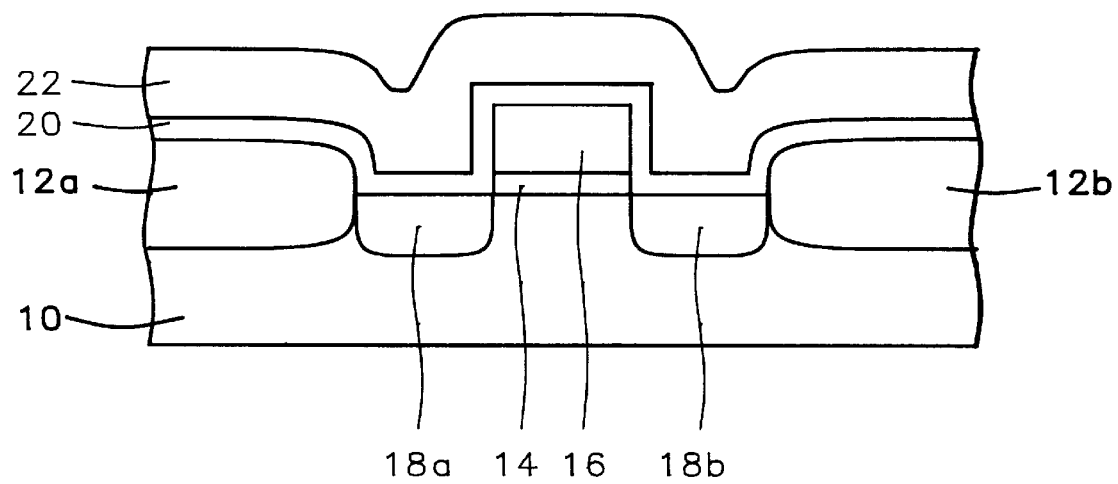

Referring now to FIG. 2 there is shown a schematic cross-sectional diagram illustrating the results of further processing of the integrated circuit whose schematic cross-sectional diagram is illustrated in FIG. 1. Shown in FIG. 2 is the presence of a conformal Pre-Metal Dielectric (PMD) layer 20 formed upon the surface of the integrated circuit whose schematic cross-sectional diagram is illustrated in FIG. 1. Although the use of the conformal Pre-Metal Dielectric (PMD) layer 20 is optional within the integrated circuit formed through the preferred embodiment of the method of the present invention, the conformal Pre-Metal Dielectric (PMD) layer 20 is nonetheless preferred since it will typically provide a superior barrier layer upon which may subsequently be formed a void-free and gap-filling doped silicon oxide insulator layer. In general, however, the method of the present invention may be employed in forming void-free and gap-filling doped silicon oxide insulator layers upon high aspect ratio narrow line-width patterned substrate layers including but not limited to patterned insulator layers and patterned conductor layers.

Methods and materials through which conformal Pre-Metal Dielectric (PMD) layers may be formed within integrated circuits are known in the art. Conformal Pre-Metal Dielectric (PMD) layers may be formed through methods including but not limited to Chemical Vapor Deposition (CVD) methods, Plasma Enhanced Chemical Vapor Deposition (PECVD) methods and Physical Vapor Deposition (PVD) sputtering methods through which may be formed conformal Pre-Metal Dielectric (PMD) layers of dielectric materials including but not limited to silicon oxide dielectric materials, silicon nitride dielectric materials and silicon oxynitride dielectric materials. For the preferred embodiment of the method of the present invention, the conformal Pre-Metal Dielectric (PMD) layer 20 is preferably formed of a silicon oxide dielectric material deposited through a Plasma Enhanced Chemical Vapor Deposition (PECVD) method, as is common in the art. Preferably, the conformal Pre-Metal Dielectric (PMD) layer 20 is from about 1000 to about 2000 angstroms thick.

Also shown in FIG. 2 is the presence of the first void-free and gap-filling doped silicon oxide insulator layer 22. It is towards forming the first void-free and gap-filling doped silicon oxide insulator layer 22, and any other void-free and gap-filling doped silicon oxide insulator layers, within the integrated circuit whose schematic cross-sectional diagram is illustrated within FIG. 1 to FIG. 5, that the preferred embodiment of the method of the present invention is directed. The method of the present invention provides optimal value in forming within an integrated circuit a void-free and gap-filling doped silicon oxide insulator layer upon a high aspect ratio narrow line-width patterned substrate layer when the width of the apertures between the patterns of the patterned substrate layer is from about 3000 to about 6000 angstroms. Similarly, the method of the present invention provides value in forming a void-free and gap-filing doped silicon oxide insulator layer upon a high aspect ratio narrow line-width patterned substrate layer when the aspect ratio of the apertures between the patterns of patterned substrate layer is at least about 1.0:1.

The first void-free and gap-filing doped silicon oxide insulator layer 22, and any subsequent void-free and gap-filling doped silicon oxide insulator layers formed within the integrated circuit formed through the preferred embodiment of the method of the present invention, are formed through a Plasma Enhanced Chemical Vapor Deposition (PECVD) deposition method undertaken simultaneously with a Reactive Ion Etch (RIE) etch-back method. The Plasma Enhanced Chemical Vapor Deposition (PECVD) deposition method and the Reactive Ion Etch (RIE) etch-back method simultaneously employ a Tetra Ethyl Ortho Silicate (TEOS) silicon source material, a dopant source material, an oxygen source material and an etching gas.

Both Plasma Enhanced Chemical Vapor Deposition (PECVD) deposition methods and Reactive Ion Etch (RIE)

etch-back methods are known in the art and commonly sequentially employed in forming insulator layers within integrated circuits. In addition, Tetra Ethyl Ortho Silicate (TEOS) silicon source materials, dopant source materials and oxygen source materials which are employed within Plasma Enhanced Chemical Vapor Deposition (PECVD) deposition methods for forming doped silicon oxide insulator layers are also known in the art. Finally, there is likewise also known in the art etching gases which are employed within Reactive Ion Etch (RIE) etch-back methods for etching doped silicon oxide insulator layers. The novelty within the method of the present invention lies at least in part in simultaneously undertaking a Plasma Enhanced Chemical Vapor Deposition (PECVD) deposition method and a Reactive Ion Etch (RIE) etch-back method in forming a void-free and gap-fling doped silicon oxide insulator layer upon a high aspect ratio narrow line-width patterned substrate layer.

For the preferred embodiment of the method of the present invention, the Tetra Ethyl Ortho Silicate (TEOS) silicon source material is preferably supplied at a flow rate of about 400 to about 600 standard cubic centimeters per minute. In order to form a doped silicon oxide insulator layer which is preferably a boron and/or phosphorus doped silicon oxide insulator layer, a boron and/or phosphorus dopant source material is preferably employed along with the Tetra Ethyl Ortho Silicate (TEOS) silicon source material. Preferably, the boron and/or phosphorus dopant source material is chosen from the group of boron and phosphorus dopant source materials consisting of borane (BH3), diborane (B2H6), phosphine (PH3), Tri-Methyl Borate (TMB; B(OCH3)3), Tri-Ethyl Borate (TEB; B(OC2H5)3), Tri-Methyl Phosphite (TMP; P(OCH3)3) and Tri-Ethyl Phosphite (TEP; P(OC2H5)3). Preferably, the dopant source material is supplied at a total flow rate of about 10 to about 30 standard cubic centimeters per minute.

In addition to the Tetra Ethyl Ortho Silicate (TEOS) silicon source material and the boron and/or phosphorus dopant source material the presence of an oxygen source material facilitates the formation of a doped silicon oxide insulator layer from the Tetra Ethyl Ortho Silicate (TEOS) silicon source material and the boron and/or phosphorus dopant source material. Although the oxygen source material may be formed from several oxygen containing materials, including but not limited to oxygen and nitrous oxide, the oxygen source material within the preferred embodiment of the method of the present invention is preferably oxygen. Preferably, the oxygen source material is supplied at a flow rate of from about 500 to about 1000 standard cubic centimeters per minute (sccm).

Finally, the last component material employed in forming the first void-free and gap-filling doped silicon oxide insulator layer 22 through the preferred embodiment of the method of the present invention is an etching gas. The etching gas is chosen of a composition which efficiently etches the first void-free and gap filling doped silicon oxide insulator layer 22 as the first void-free and gap filling doped silicon oxide insulator layer 22 is being formed. As is known in the art of integrated circuit design and manufacture, such etching gases typically, although not exclusively, are formed of materials which efficiently produce fluorine etching species when excited within a Reactive Ion Etch (RIE) etch-back plasma. Although there are several fluorine containing materials which efficiently produce fluorine etching species, for the preferred embodiment of the method of the present invention the etching gas is preferably chosen from the group of fluorine etching species producing etching gases consisting of C1–C2 per-fluorocarbons, C1–C2 hydrofluorocarbons and nitrogen trifluoride (NF3). Preferably, the etching gas is supplied at a flow rate of from about 30 to about 120 standard cubic centimeters per minute (sccm).

In addition to the Tetra Ethyl Ortho Silicate (TEOS) silicon source material, the dopant source material, the oxygen source material and the etching gas, there are several additional parameters within the simultaneous Plasma Enhanced Chemical Vapor Deposition (PECVD) deposition method and Reactive Ion Etch (RIE) etch-back method of the present invention which are preferably controlled in forming the first void-free and gap-filling doped silicon oxide insulator layer 22. These parameters include, but are not limited to: (1) a reactor chamber pressure of from about 5 to about 10 torr, (2) a radio frequency power of from about 300 to about 700 watts, (3) a semiconductor substrate temperature of from about 400 to about 450 degrees centigrade, and (4) an electrode spacing of from about 200 to about 400 mils.

Through employing the method, materials and process conditions outlined above, there is formed the first void-free and gap-filling doped silicon oxide insulator layer 22 through the preferred embodiment of the method of the present invention. The first void-free and gap-filling doped silicon oxide insulator layer so formed is typically and preferably from about 5000 to about 8000 angstroms in thickness. As is shown in FIG. 2, the first void-free and gap-filling doped silicon oxide insulator layer is substantially but not entirely conformal.

Figure 3:
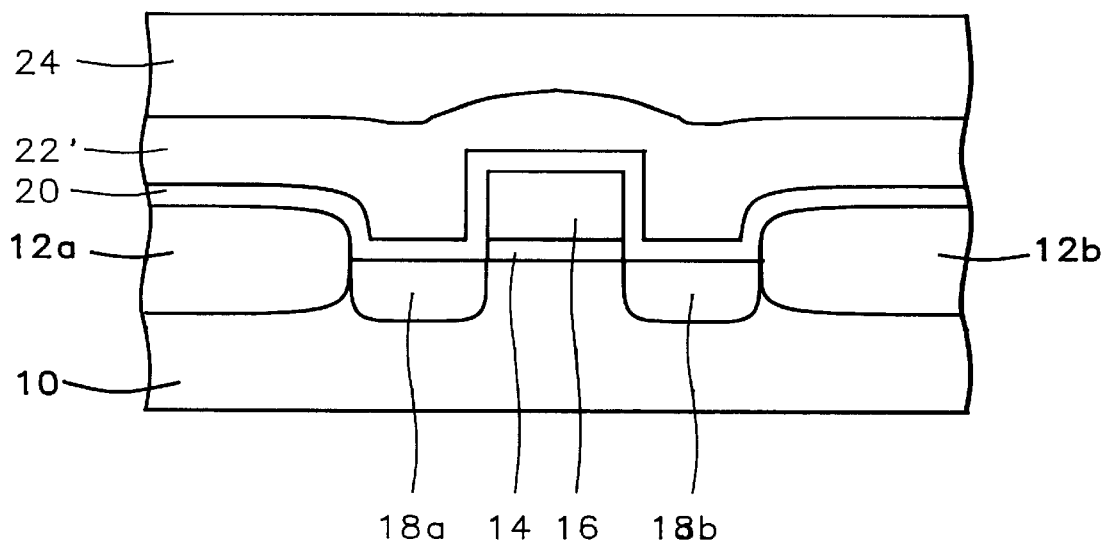

Referring now to FIG. 3 there is shown a schematic cross-sectional diagram illustrating the results of further processing of the integrated circuit whose schematic cross-sectional diagram is illustrated in FIG. 2. Shown in FIG. 3 is the presence of a reflowed first void-free and gap-filling doped silicon oxide insulator layer 22' upon which resides a planarized Pre-Metal Dielectric (PMD) layer 24.

Although it is not required within the preferred embodiment of the method of the present invention, it is preferred that the first void-free and gap-filling doped silicon oxide insulator layer 22 be reflowed to form the reflowed first void-free and gap-filling doped silicon oxide insulator layer 22'. Upon reflowing, the reflowed first void-free and gap-filling doped silicon oxide insulator layer 22' provides a more planar surface upon which may be formed subsequent layers within the integrated circuit within which is formed the reflowed first void-free and gap-filling doped silicon oxide insulator layer 22'. Methods through which doped silicon oxide insulator layers within integrated circuits may be reflowed are known in the art. Such methods include but are not limited to conventional thermal reflow methods, as well as: (1) Rapid Thermal Processing (RTP) reflow methods which employ intense heat for a period of several seconds, and (2) laser processing reflow methods which employ intense laser light of appropriate wavelength to be absorbed and dissipated as heat. Although any of the above methods may be employed in forming the reflowed first void-free and gap-filling doped silicon oxide insulator layer 22' from the first void-free and gap-filling doped silicon oxide insulator layer 22, preferably, the reflowed first void-free and gap-filling doped silicon oxide insulator layer 22' is formed through a conventional thermal reflow method wherein the first void-free and gap-filling doped silicon oxide insulator layer 22 is reflowed at a temperature of from about 800 to about 950 degrees centigrade for a time period of from about 20 to about 40 minutes.

Formed then upon the reflowed first void-free and gap-filling doped silicon oxide insulator layer 22' is the planarized Pre-Metal Dielectric (PMD) layer 24. Methods and materials through which may be formed planarized Pre-Metal Dielectric (PMD) layers within integrated circuits are known in the art. Planarized Pre-Metal Dielectric (PMD) layers are typically, although not exclusively, formed through planarizing through methods as are conventional in the art of conformal Pre-Metal Dielectric (PMD) layers. Analogously with the conformal Pre-Metal Dielectric (PMD) layer 20, conformal Pre-Metal Dielectric (PMD) layers may in general be formed through methods and materials including but not limited to Chemical Vapor Deposition (CVD) methods, Plasma Enhanced Chemical Vapor Deposition (PECVD) methods and Physical Vapor Deposition (PVD) sputtering methods through which may be formed conformal Pre-Metal Dielectric (PMD) layers of dielectric materials including but not limited to silicon oxide dielectric materials, silicon nitride dielectric materials and silicon oxynitride dielectric materials. For the preferred embodiment of the method of the present invention, the planarized Pre-Metal Dielectric (PMD) layer 24 is preferably formed from a conformal Pre-Metal Dielectric (PMD) layer formed of a silicon oxide dielectric material deposited through a Plasma Enhanced Chemical Vapor Deposition (PECVD) method. The conformal Pre-Metal Dielectric (PMD) layer so formed may be planarized through a Chemical Mechanical Polish (CMP) planarizing method or a Reactive Ion Etch (RIE) etch-back planarizing method, as is conventional in the art, to form the planarized Pre-Metal Dielectric (PMD) layer 24. Preferably, the planarized Pre-Metal Dielectric (PMD) layer 24 is from about 1000 to about 5000 angstroms thick after it has been planarized preferably through a Chemical Mechanical Polish (CMP) planarizing method.

Figure 4:
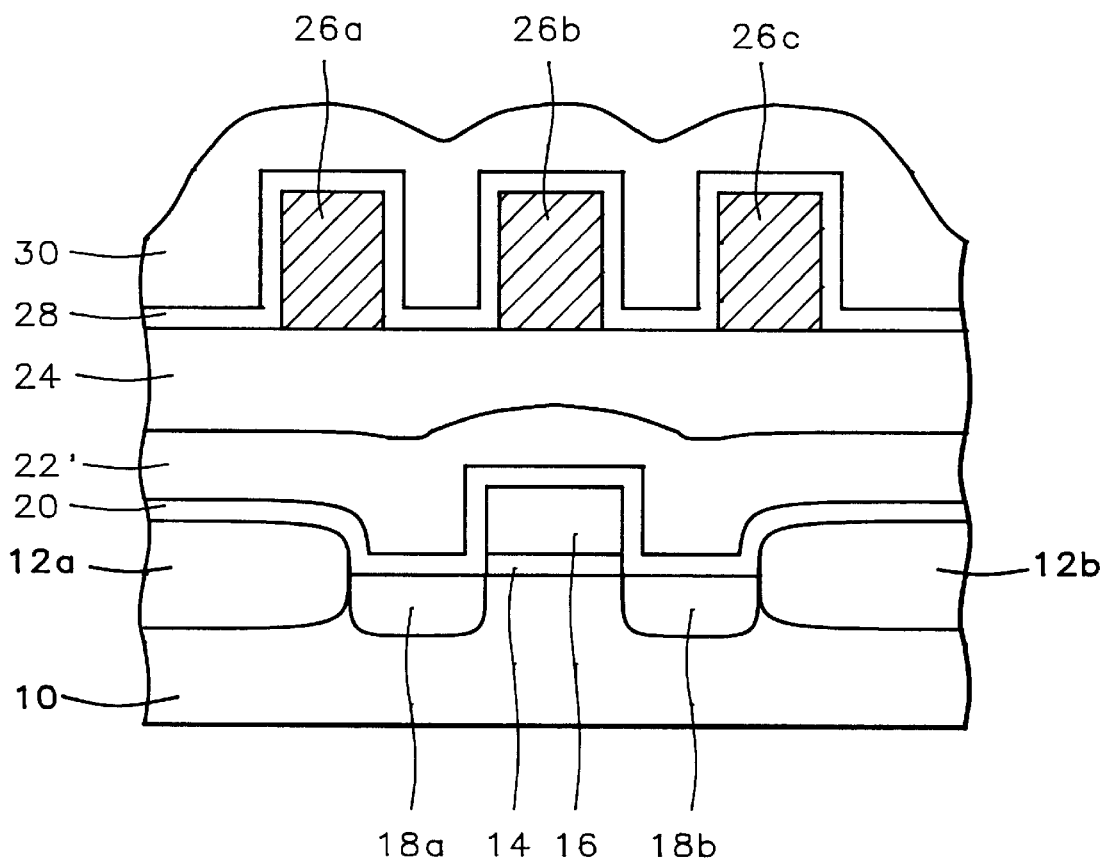

Referring now to FIG. 4, there is shown a schematic cross-sectional diagram illustrating the results of further processing of the integrated circuit whose schematic cross-sectional diagram is illustrated in FIG. 3. Shown in FIG. 4 is the presence of a series of patterned first conductor layers 26a, 26b and 26c, upon which resides a conformal first Inter-Conductor Dielectric (ICD) layer 28, upon which in turn resides a second void-free and gap-filling doped silicon oxide insulator layer 30. The patterned first conductor layers 26a, 26b and 26c, and the conformal first Inter-Conductor Dielectric (ICD) layer 28, are conventional to the art. The conformal first Inter-Conductor Dielectric (ICD) layer 28 is preferably formed through methods, materials and dimensions equivalent to the methods, materials and dimensions through which is formed the conformal Pre-Metal Dielectric (PMD) layer 20.

Methods and materials through which patterned conductor layers may be formed within integrated circuits are known in the art. Patterned conductor layers are typically, although not exclusively, formed through patterning through methods as are conventional in the art of blanket conductor layers. Blanket conductor layers may be formed through methods and materials including but not limited to thermal evaporation methods, electron beam assisted evaporation methods, Chemical Vapor Deposition (CVD) methods and Physical Vapor Deposition (PVD) sputtering methods through which may be formed blanket conductor layers of conductor materials including but not limited to metals, metal alloys and highly doped polysilicon. For the preferred embodiment of the method of the present invention, the series of patterned first conductor layers 26a, 26b and 26c is preferably formed through patterning through a method as is conventional in the art of a blanket conductor layer which is formed at least in part of an aluminum containing conductor material, as is common in the art. Typically, the patterned first conductor layers 26a, 26b and 26c are from about 4000 to about 10000 angstroms thick in height upon the surface of the planarized Pre-Metal Dielectric (PMD) layer 24. Analogously with the integrated circuit structure upon which is formed the first void-free and gap-filling doped silicon oxide insulator layer 22, the series of patterned first conductor layers 26a, 26b and 26c upon which is formed the second void-free and gap-filling doped silicon oxide insulator layer 30 also preferably have a width of the apertures between the patterns of the series of patterned first conductor layers 26a, 26b and 26c of from about 3000 to about 6000 angstroms and an aspect ratio of apertures between the patterns of the series of patterned first conductor layers 26a, 26b and 26c of greater than about 1.0:1.

The second void-free and gap-filling doped silicon oxide insulator layer 30 is preferably formed through methods, materials and dimensions similar to the methods, materials and dimensions through which is formed the first void-free and gap-filling doped silicon oxide insulator layer 22. However, the second void free and gap-filling silicon oxide insulator layer 30 is preferably not reflowed. The second void-free and gap-filling doped silicon oxide insulator layer 30 so formed is also preferably formed through a simultaneous Plasma Enhanced Chemical Vapor Deposition (PECVD) deposition method and Reactive Ion Etch (RIE) etch-back method employing a Tetra Ethyl Ortho Silicate (TEOS) silicon source material, a dopant source material, an oxygen source material and an etching gas.

Figure 5:
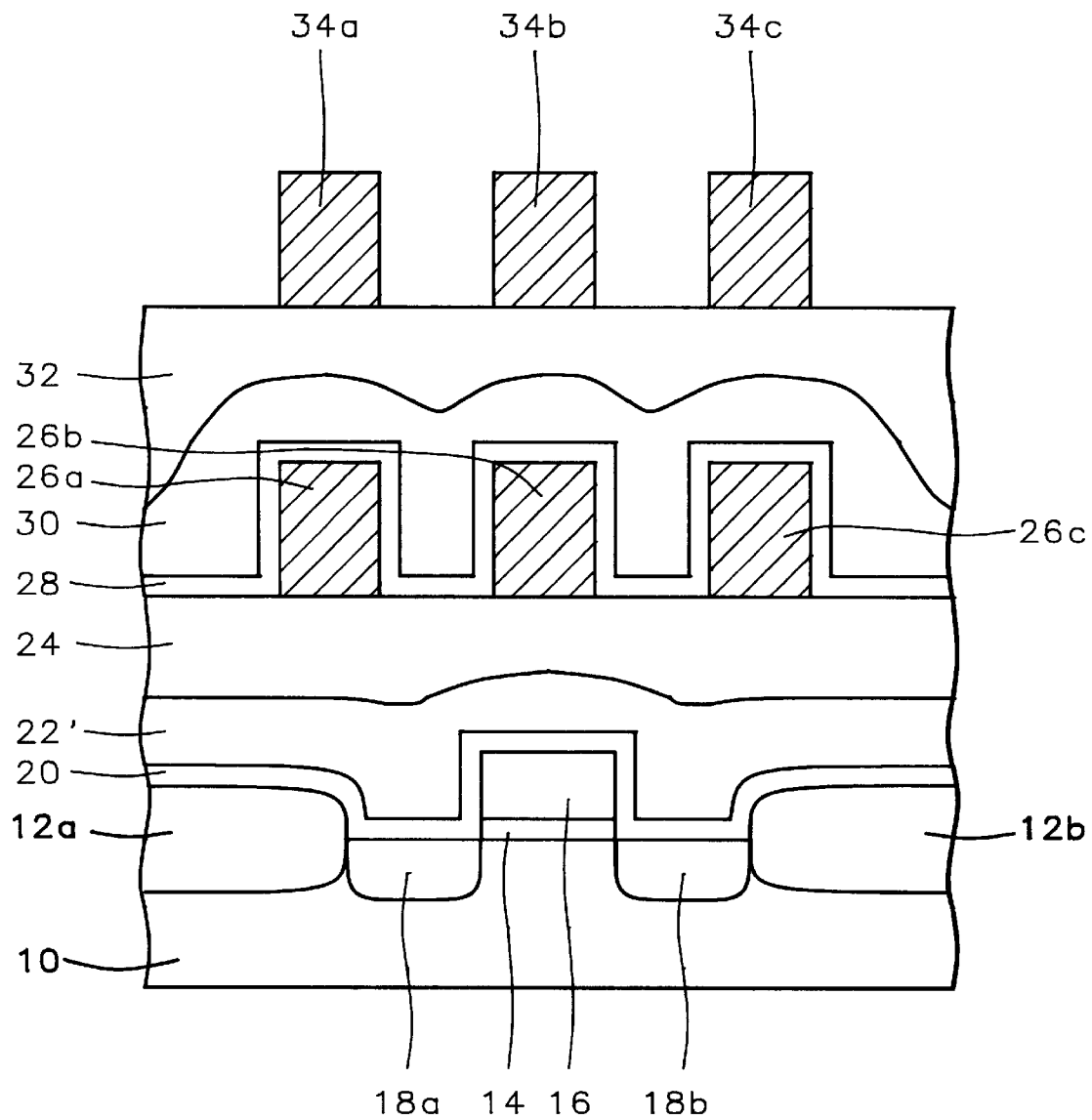

Referring now to FIG. 5 there is shown a schematic cross-sectional diagram illustrating the results of further processing of the integrated circuit whose schematic cross-sectional diagram is illustrated in FIG. 4. Shown in FIG. 5 is the presence of the second void-free and gap-filling doped silicon oxide insulator layer 30 upon which resides a planarized first Inter-Level Dielectric (ILD) layer 32. The planarized first Inter-Level Dielectric (ILD) layer 32 is preferably formed through methods, materials and dimensions equivalent to the methods, materials and dimensions through which is formed the planarized Pre-Metal Dielectric (PMD) layer 24.

Finally, there is shown in FIG. 5 the presence of a series of patterned second conductor layers 34a, 34b and 34c. The series of patterned second conductor layers 34a, 34b and 34c is preferably formed through methods, materials and dimensions equivalent to the methods, materials and dimensions through which is formed the series of patterned first conductor layers 26a, 26b and 26c.

Upon forming the series of patterned second conductor layers 34a, 34b and 34c, there is formed through the preferred embodiment of the method of the present invention an integrated circuit. The integrated circuit has formed therein multiple void-free and gap-filling doped silicon oxide insulator layers upon high aspect ratio narrow linewidth patterned substrate layers. One of the void-free and gap-filling doped silicon oxide insulator layers (i.e.: the first void-free and gap filling doped silicon oxide insulator layer 22) is easily reflowed to form within the integrated circuit a reflowed void-free and gap-filling doped silicon oxide insulator layer which provides a more planar substrate layer for additional layers within the integrated circuit within which is formed the void-free and gap-filling doped silicon oxide insulator layers.

As is understood by a person skilled in the art, the preferred embodiment of the method of the present invention is illustrative of the method of the present invention rather than limiting of the method of the present invention. Revisions may be made to methods, materials, structures and dimensions through which is formed void-free and gap-filling doped silicon oxide insulator layers through the preferred embodiment of the method of the present invention while still forming void-free and gap-filling doped silicon oxide insulator layers through a method which is within the spirit and scope of the method of the present invention, as defined by the appended claims.

What is claimed is:

1. A method for forming a doped silicon oxide insulator layer upon a patterned substrate layer comprising:

forming upon a semiconductor substrate a patterned substrate layer;

forming upon the patterned substrate layer a doped silicon oxide insulator layer, the doped silicon oxide insulator layer being formed through a Plasma Enhanced Chemical Vapor Deposition (PECVD) deposition method undertaken simultaneously with a Reactive Ion Etch (RIE) etch-back method, the Plasma Enhanced Chemical Vapor Deposition (PECVD) deposition method and the Reactive Ion Etch (RIE) etch-back method simultaneously employing a Tetra Ethyl Ortho Silicate (TEOS) silicon source material, a dopant source material, an oxygen source material and an etching gas.

2. The method of claim 1 wherein the patterned substrate layer is a patterned insulator layer.

3. The method of claim 1 wherein the pattered substrate layer is a patterned conductor layer.

4. The method of claim 1 wherein a width of the apertures between the patterns of the patterned substrate layer is from about 3000 to about 6000 angstroms.

5. The method of claim 1 wherein an aspect ratio of the apertures between the patterns of the patterned substrate layer is at least about 1.0:1.

6. The method of claim 1 wherein the Tetra Ethyl Ortho Silicate (TEOS) silicon source material is supplied at a flow rate of about 400 to about 600 standard cubic centimeters per minute.

7. The method of claim 1 wherein the dopant source material is chosen from the group of dopant source materials consisting of borane ($BH_3$), diborane ($B_2H_6$), phosphine ($PH_3$), Tri-Methyl Borate (TMB; $B(OCH_3)_3$), Tri-Ethyl Borate (TEB; $B(OC_2H_5)_3$), Tri-Methyl Phosphite (TMP; $P(OCH_3)_3$) and Tri-Ethyl Phosphite (TEP; $P(OC_2H_5)_3$).

8. The method of claim 1 wherein the dopant source material is supplied at a flow rate of about 10 to about 30 standard cubic centimeters per minute (sccm).

9. The method of claim 1 wherein the oxygen source material is oxygen.

10. The method of claim 1 wherein the oxygen source material is supplied at a flow rate of from about 500 to about 1000 standard cubic centimeters per minute (sccm).

11. The method of claim 1 wherein the etching gas is chosen from the group of etching gases consisting of $C_1$–$C_2$ per-fluorocarbons, $C_1$–$C_2$ hydro-fluorocarbons and nitrogen trifluoride ($NF_3$).

12. The method of claim 1 wherein the etching gas is supplied at a flow rate of from about 30 to about 120 standard cubic centimeters per minute (sccm).

13. The method of claim 1 wherein the Plasma Enhanced Chemical Vapor Deposition (PECVD) deposition method and the Reactive Ion Etch (RIE) etching method are simultaneously undertaken at a reactor chamber pressure of from about 5 to about 10 torr and a radio frequency power of from about 300 to about 700 watts.

14. The method of claim 1 wherein a thickness of the doped silicon oxide insulator layer is from about 5000 to about 8000 angstroms.

15. A method for forming a doped silicon oxide insulator layer upon a patterned substrate layer within an integrated circuit comprising:

forming upon a semiconductor substrate an integrated circuit, the integrated circuit having at least one transistor formed therein;

forming within the integrated circuit a patterned substrate layer;

forming upon the patterned substrate layer a doped silicon oxide insulator layer, the doped silicon oxide insulator layer being formed through a Plasma Enhanced Chemical Vapor Deposition (PECVD) deposition method undertaken simultaneously with a Reactive Ion Etch (RIE) etch-back method, the Plasma Enhanced Chemical Vapor Deposition (PECVD) deposition method and the Reactive Ion Etch (RIE) etch-back method simultaneously employing a Tetra Ethyl Ortho Silicate (TEOS) silicon source material, a dopant source material, an oxygen source material and an etching gas.

16. The method of claim 15 wherein the transistor is a Field Effect Transistor (FET).

17. The method of claim 15 wherein the patterned substrate layer is chosen from the group of patterned substrate layers consisting of patterned conductor layers and patterned insulator layers.

18. The method of claim 15 wherein:

a width of the apertures between the patterns of the patterned substrate layer is from about 3000 to about 6000 angstroms; and, an aspect ratio of the apertures between the patterns of the patterned substrate layer is at least about 1.0:1.

19. The method of claim 15 wherein the Tetra Ethyl Ortho Silicate (TEOS) silicon source material is supplied at a flow rate of about 400 to about 600 standard cubic centimeters per minute.

20. The method of claim 15 wherein:

the dopant source material is chosen from the group of dopant source materials consisting of borane ($BH_3$), diborane ($B_2H_6$), phosphine ($PH_3$); Tri-Methyl Borate (TMB; $B(OCH_3)_3$), Tri-Ethyl Borate (TEB; $B(OC_2H_5)_3$), Tri-Methyl Phosphite (TMP; $P(OCH_3)_3$) and Tri-Ethyl Phosphite (TEP; $P(OC_2H_5)_3$); and, the dopant source material is supplied at a flow rate of about 10 to about 30 standard cubic centimeters per minute (sccm).

21. The method of claim 15 wherein:

the oxygen source material is oxygen; and, the oxygen source material is supplied at a flow rate of from about 500 to about 1000 standard cubic centimeters per minute (sccm).

22. The method of claim 15 wherein:

the etching gas is chosen from the group of etching gases consisting of $C_1$–$C_2$ per-fluorocarbons, $C_1$–$C_2$ hydro-fluorocarbons and nitrogen trifluoride ($NF_3$); and, the etching gas is supplied at a flow rate of from about 30 to about 120 standard cubic centimeters per minute (sccm).

23. The method of claim 15 wherein the Plasma Enhanced Chemical Vapor Deposition (PECVD) deposition method and the Reactive Ion Etch (RIE) etch-back method are simultaneously undertaken at a reactor chamber pressure of from about 5 to about 10 torr and a radio frequency power of from about 300 to about 700 watts.

24. The method of claim 15 wherein a thickness of the silicon oxide insulator layer is from about 5000 to about 8000 angstroms.

* * * * *